United States Patent
Shin et al.

(10) Patent No.: US 11,482,286 B2
(45) Date of Patent: Oct. 25, 2022

(54) MEMORY DEVICE AND OPERATING METHOD THEREOF

(71) Applicant: SK hynix Inc., Icheon-si (KR)

(72) Inventors: Jae Hyeon Shin, Icheon-si (KR); Tae Ho Kim, Icheon-si (KR); In Gon Yang, Icheon-si (KR); Sungmook Lim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 47 days.

(21) Appl. No.: 17/191,530

(22) Filed: Mar. 3, 2021

(65) Prior Publication Data
US 2022/0068388 A1 Mar. 3, 2022

(30) Foreign Application Priority Data
Aug. 28, 2020 (KR) .......................... 10-2020-0109111

(51) Int. Cl.
| G11C 16/04 | (2006.01) |
| G11C 16/08 | (2006.01) |
| G11C 16/10 | (2006.01) |
| G11C 16/24 | (2006.01) |

(52) U.S. Cl.
CPC .......... *G11C 16/0483* (2013.01); *G11C 16/08* (2013.01); *G11C 16/10* (2013.01); *G11C 16/24* (2013.01); *G11C 16/04* (2013.01)

(58) Field of Classification Search
CPC ..................................................... G11C 16/04
See application file for complete search history.

(56) References Cited

U.S. PATENT DOCUMENTS

2018/0082731 A1* 3/2018 Lee ..................... H01L 27/0688

FOREIGN PATENT DOCUMENTS

| KR | 101463584 B1 | 11/2014 |
| KR | 1020150117152 A | 10/2015 |
| KR | 1020180119998 A | 11/2018 |

* cited by examiner

*Primary Examiner* — Jason Lappas
(74) *Attorney, Agent, or Firm* — William Park & Associates Ltd.

(57) ABSTRACT

A memory device capable of reducing a peak current includes a plurality of memory cell strings each including a plurality of memory cells connected between a common source line and a bit line, a source select line connected between the common source line and the plurality of memory cells, and a drain select line connected between the bit line and the plurality of memory cells. A method for operating the memory device includes: precharging channel regions of a plurality of memory cell strings through a common source line; and setting a bit line voltage applied to the bit line, after starting precharging the channel regions of the plurality of memory cell strings, while the channel regions of the plurality of memory cell strings are being precharged.

20 Claims, 15 Drawing Sheets

MEMORY DEVICE AND OPERATING METHOD THEREOF

CROSS-REFERENCE TO RELATED APPLICATION

The present application claims priority under 35 U.S.C. § 119(a) to Korean patent application number 10-2020-0109111, filed on Aug. 28, 2020, in the Korean Intellectual Property Office, the entire disclosure of which is incorporated herein by reference.

BACKGROUND

1. Technical Field

The present disclosure generally relates to an electronic device, and more particularly, to a memory device and an operating method thereof.

2. Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

Embodiments provide a memory device capable of reducing a peak current and an operating method of the memory device.

In accordance with an aspect of the present disclosure, there is provided a method of operating a memory device including a plurality of memory cell strings each including a plurality of memory cells connected between a common source line and a bit line, a source select line connected between the common source line and the plurality of memory cells, and a drain select line connected between the bit line and the plurality of memory cells, the method including: precharging channel regions of the plurality of memory cell strings through the common source line; and setting a bit line voltage applied to the bit line, after starting precharging the channel regions of the plurality of memory cell strings, while the channel regions of the plurality of memory cell strings are being precharged.

In accordance with another aspect of the present disclosure, there is provided a memory device including: a plurality of memory blocks each including a plurality of memory cell strings each including a plurality of memory cells connected in series between a common source line and a bit line, a plurality of source select lines connected in series between the common source line and the plurality of memory cells, and a plurality of drain select lines connected in series between the bit line and the plurality of memory cells; a peripheral circuit configured to perform a plurality of program loops each including a program voltage apply step of providing a program voltage to a selected memory block among the plurality of memory blocks and a verify step of verifying a program state of the selected memory block; and a program operation controller configured to control the peripheral circuit to precharge channel regions of the plurality of memory cell strings through the common source line and to set a bit line voltage applied to the bit line, at a predetermined time with respect to starting precharging the channel regions of the plurality of memory cell strings, in the program voltage apply step.

In accordance with still another aspect of the present disclosure, there is provided a method of operating a memory device including a plurality of memory cell strings each including a plurality of memory cells connected between a common source line and a bit line, a source select line connected between the common source line and the plurality of memory cells, and a drain select line connected between the bit line and the plurality of memory cells, the method including: increasing a voltage of the common source line; increasing a voltage applied to the source select line of each of the plurality of memory cell strings through the common source line; and setting, after a predetermined elapsed time, a bit line voltage applied to the bit line, after the voltage applied to the source select line of each of the plurality of memory cell strings is increased, while the voltage applied to the source select line of each of the plurality of memory cell strings is increased.

In accordance with an aspect of the present disclosure, there is provided a memory device including a plurality of memory blocks each including: a plurality of memory cell strings each including a plurality of memory cells connected in series between a common source line and a bit line wherein at least one memory cell is a dummy memory cell, a plurality of source select lines connected in series between the common source line and the plurality of memory cells, and a plurality of drain select lines connected in series between the bit line and the plurality of memory cells, a peripheral circuit configured to perform a plurality of program loops each including a program voltage apply step of providing a program voltage to a selected memory block among the plurality of memory blocks and a verify step of verifying a program state of the selected memory block, and a program operation controller configured to control the peripheral circuit to precharge channel regions of the plurality of memory cell strings through the common source line and to set a bit line voltage applied to the bit line, at a predetermined time with respect to starting precharging the channel regions of the plurality of memory cell strings, in the program voltage apply step.

The at least one dummy memory cell may decrease an electric field between a predetermined source select transistor and a predetermined first portion of the plurality of the memory cells.

The at least one dummy memory cell may decrease an electric field between a predetermined drain select transistor and a predetermined second portion of the memory cells.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure may be implemented in various forms, and might not be construed as limited to the embodiments set forth herein.

Figure 1:
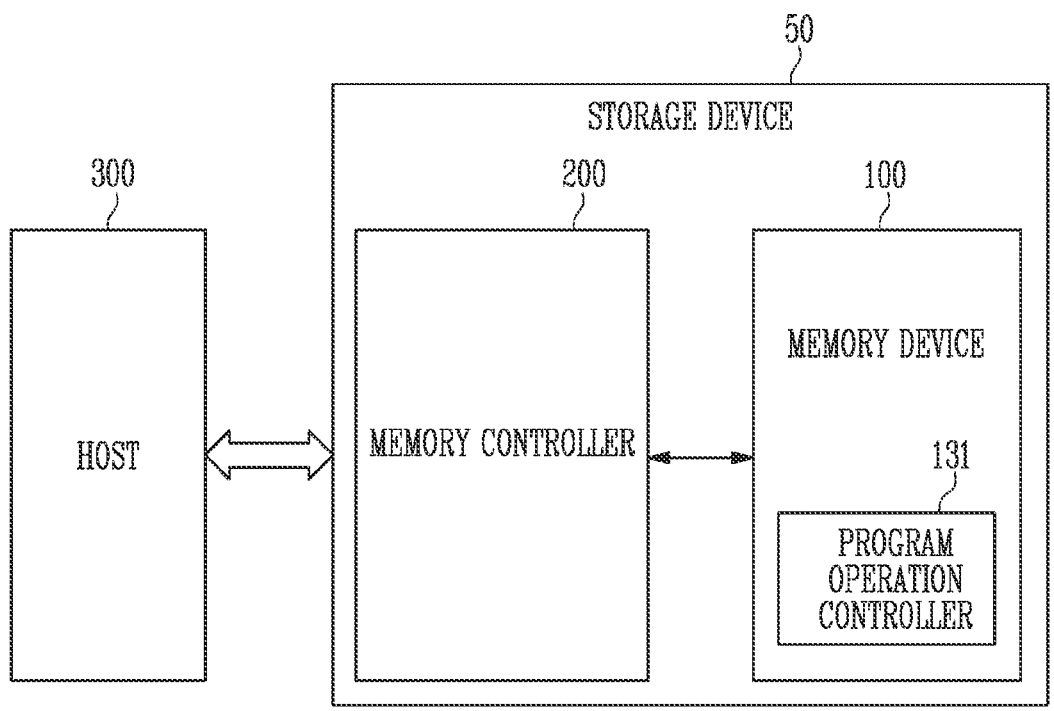
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 50 may include a memory device 100 and a memory controller 200 for controlling an operation of the memory device 100. The storage device 50 may be a device for storing data under the control of a host 300, such as a mobile phone, a smart phone, an MP3 player, a laptop computer a desktop computer, a game console, a TV, a tablet PC or an in-vehicle infotainment system.

The storage device 50 may be manufactured as any one of various types of storage devices according to a host interface that is arranged in a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 may operate under the control of the memory controller 200. The memory device 100 may include a memory cell array (not shown) including a plurality of memory cells for storing data.

Each of the memory cells may operate as any one of a Single Level Cell (SLC) storing one data bit, a Multi-Level Cell (MLC) storing two data bits, a Triple Level Cell (TLC) storing three data bits, and a Quadruple Level Cell (QLC) storing four data bits.

The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100, The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case in which the memory device 100 is a NAND flash memory is assumed and described.

The memory device 100 may receive a command CMD and an address ADDR from the memory controller 200, and access a zone selected by the address ADDR in the memory cell array. The memory device 100 may perform an operation indicated by the command CMD on the zone selected by the address ADDR. For example, the memory device 100 may perform a write operation (program operation), a read operation, and an erase operation. In the program operation, the memory device 100 may program data in the zone selected by the address ADDR. In the read operation, the memory device 100 may read data from the zone selected by the address ADDR. In the erase operation, the memory device 100 may erase data stored in the zone selected by the address ADDR.

In an embodiment, the memory device 100 may include a program operation controller 131.

The program operation controller 131 may perform a program operation of storing data in a plurality of memory cells included in the memory device 100.

In an embodiment, the program operation controller 131 may control the memory device to precharge channel regions of a plurality of memory cell strings including a plurality of memory cells and to set a voltage applied to bit lines connected to the plurality of memory cells, wherein precharging channels may be started and then may be followed by setting a bit line voltage that may be applied to the bit line during at least a predetermined portion of the precharging.

In an embodiment, the memory device 100 may precharge the channel regions of the plurality of memory cell strings through a common source line.

Also, in an embodiment, while the channel regions of the plurality of memory cell strings are being precharged, the memory device 100 may set a bit line voltage applied to a bit line, after starting the precharging of the channel regions of the plurality of memory cell strings.

The memory controller 200 may control overall operations of the storage device 50.

When power is applied to the storage device 50, the memory controller 200 may execute firmware (FW). When the memory device 100 is a flash memory device, the FW may include a host interface layer (HIL) for controlling communication with the host 300, a flash translation layer (FTL) for controlling communication between the host and the memory device 100, and a flash interface layer (FIL) for controlling communication with the memory device 100.

In an embodiment, the memory controller 200 may receive data and a Logical Block Address (LBA) from the host 300, and translate the LBA into a Physical Block Address (PBA) representing addresses of memory cells included in the memory device 100, in which data is to be stored. In this specification, the LBA and a "logic address" or "logical address" may be used with the same meaning. In this specification, the PBA and a "physical address" may be used with the same meaning.

The memory controller 200 may control the memory device 100 to perform a program operation, a read operation, an erase operation, or the like in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a command, an address, and data regardless of any request from the host 300, and transmit the command, the address, and the data to the memory device 100. For example, the memory controller 200 may provide the memory device 100 with a command, an address, and data, which are used to perform read and program operations accompanied in performing wear leveling, read reclaim, garbage collection, etc.

In an embodiment, the memory controller 200 may control at least two memory devices 100. The memory controller 200 may control the memory devices according to an interleaving technique so as to improve operational performance. The interleaving technique may be a method for controlling operations on at least two memory devices 100 to overlap with each other.

Figure 2:
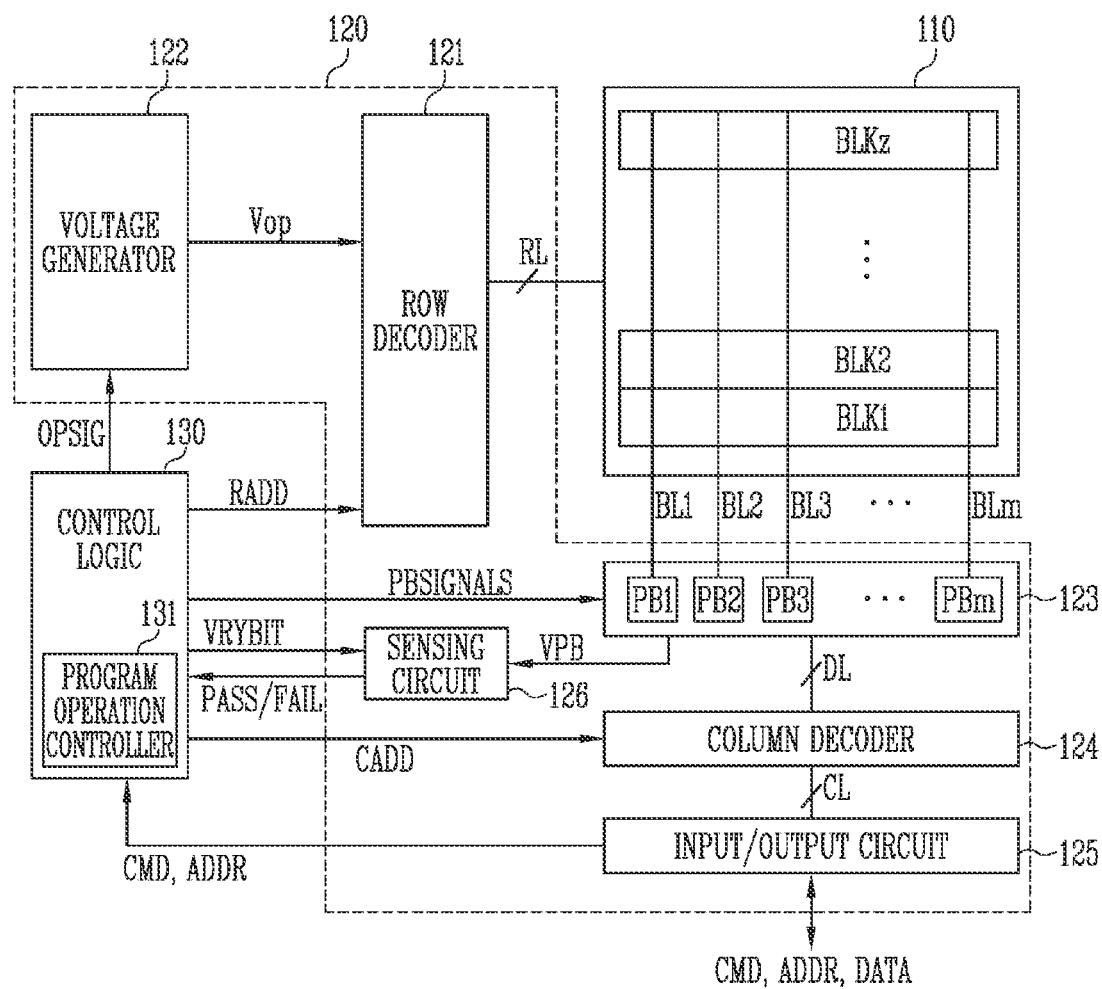
FIG. 2 is a diagram illustrating a memory device shown in FIG. 1.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM), FIG. 2 is a diagram illustrating the memory device 100 shown in FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be connected to a row decoder 121 through row lines RL, The plurality of memory blocks BLK1 to BLKz may be connected to a page buffer group 123 through bit lines BL1 to BLm. Each of the plurality of memory blocks BLK1 to BLKz may include a plurality of memory cells. In an embodiment, the plurality of memory cells may be nonvolatile memory cells. Memory cells connected to the same word line may be defined as one page, Therefore, one memory block may include a plurality of pages.

The row lines RL may include at least one source select line, a plurality of word lines, and at least one drain select line.

Each of the memory cells included in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may perform a program operation, a read operation or an erase operation on a selected region of the memory cell array 110 under the control of the control logic 130, The peripheral circuit 120 may drive the memory cell array 110, For example, the peripheral circuit 120 may apply various operating voltages to the row lines RL and the bit lines BL1 to BLm or discharge the applied voltages under the control of the control logic 130.

The peripheral circuit 120 may include the row decoder 121, the voltage generator 122, the page buffer group 123, a column decoder 124, an input/output circuit 125, and a sensing circuit 126.

The row decoder 121 may be connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may operate under the control of the control logic. The row decoder 121 may receive a row address RADD from the control logic 130.

The row decoder 121 may decode the row address RADD, The row decoder 121 may select at least one memory block among the memory blocks BLK1 to BLKz according to the decoded address. Also, the row decoder 121 may select at least one word line of the selected memory block to apply voltages generated by the voltage generator 122 to the at least one word line WL according to the decoded address.

For example, in a program operation, the row decoder 121 may apply a program voltage to the selected word line and may apply a program pass voltage with a level lower than that of the program voltage to unselected word lines. In a program verify operation, the row decoder 121 may apply a verify voltage to the selected word line, and may apply a verify pass voltage with a level higher than that of the verify voltage to the unselected word lines.

In a read operation, the row decoder 121 may apply a read voltage to the selected word line and may apply a read pass voltage with a level higher than that of the read voltage to the unselected word lines.

In an embodiment, an erase operation of the memory device 100 may be performed in a memory block unit. In the erase operation, the row decoder 121 may select one memory block according to the decoded address. In the erase operation, the row decoder 121 may apply a ground voltage to word lines connected to the selected memory blocks.

The voltage generator 122 may operate under the control of the control logic 130. The voltage generator 122 may generate a plurality of voltages by using an external power voltage supplied to the memory device 100. Specifically, the voltage generator may generate various operating voltages Vop used in program, read, and erase operations in response to an operation signal OPSIG For example, the voltage generator 122 may generate a program voltage, a verify voltage, a pass voltage, a read voltage, an erased voltage, and the like under the control of the control logic 130.

In an embodiment, the voltage generator 122 may generate an internal power voltage by regulating the external power voltage. The internal power voltage generated by the voltage generator 122 may be used as an operation voltage of the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage and may generate the plurality of voltages by selectively activating the plurality of pumping capacitors under the control of the control logic 130.

The plurality of generated voltages may be supplied to the memory cell array 110 by the row decoder 121.

The page buffer group 123 may include first to mth page buffers PB1 to PBm. The first to mth page buffers PB1 to PBm may be connected to the memory cell array 110 respectively through first to mth bit lines BL1 to BLm. The first to mth bit lines BL1 to BLm may operate under the control of the control logic 130. Specifically, the first to mth bit lines BL1 to BLm may operate in response to page buffer control signals PBSIGNALS. For example, the first to mth page buffers PB1 to PBm may temporarily store data received through the first to mth bit lines BL1 to BLm, or sense a voltage or current of the bit lines BL1 to BLm in a read or verify operation.

Specifically, in a program operation, the first to mth page buffers PB1 to PBm may transfer data DATA received through the input/output circuit 125 to selected memory cells through the first to mth bit lines BL1 to BLm, when a program voltage is applied to a selected word line. Memory cells of a selected page may be programmed according to the transferred data DATA. A memory cell connected to a bit line to which a program allow voltage (e.g., a ground voltage) is applied may have an increased threshold voltage, A threshold voltage of a memory cell connected to a bit line to which a program inhibit voltage (e.g., a power voltage) is applied may be maintained. In a program verify operation, the first to mth page buffers PB1 to PBm may read page data from the selected memory cells through the first to mth bit lines BL1 to BLm.

In a read operation, the first to mth page buffers PB1 to PBm may read data DATA from the memory cells of the selected page through the first to mth bit lines BL1 to BLm, and may output the read data DATA to the input/output circuit 125 under the control of the column decoder 124.

In an erase operation, the first to mth page buffers PB1 to PBm may float the first to mth bit lines BL1 to BLm.

The column decoder 124 may communicate data between the input/output circuit 125 and the page buffer group 123 in response to a column address CADD. For example the column decoder 124 may communicate data with the first to mth page buffers PB1 to PBm through data lines DL or may communicate data with the input/output circuit 125 through column lines CL.

The input/output circuit 125 may transfer a command CMD and an address ADDR, which may be received from the memory controller 200 described with reference to FIG. 1, to the control logic 130, or may exchange data DATA with the column decoder 124.

In a read operation or verify operation, the sensing circuit 126 may generate a reference current in response to an allow bit VRYBIT signal and may output a pass signal PASS or fail signal FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. Also, the control logic 130 may determine whether the verify operation has passed or failed in response to the pass signal PASS or fail signal FAIL.

In an embodiment, the control logic 130 may include a program operation controller 131.

The program operation controller 131 may perform a program operation of storing data in a plurality of memory cells included in the memory device 100.

In an embodiment, the program operation controller 131 may control the memory device to precharge channel regions of a plurality of memory cell strings including a plurality of memory cells and to set a voltage applied to bit lines connected to the plurality of memory cells, wherein precharging channel regions may be started and then setting a voltage applied to bit lines may be started.

The program operation controller 131 will be described in detail with reference to FIG. 11.

Figure 3:
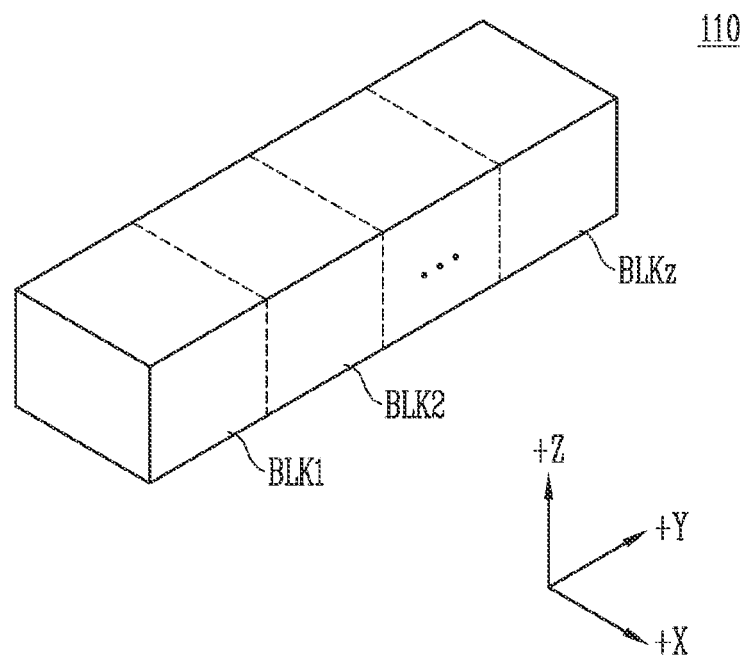
FIG. 3 is a diagram illustrating an embodiment of a memory cell array shown in FIG. 2.

FIG. 3 is a diagram illustrating an embodiment of the memory cell array shown in FIG. 2.

Referring to FIG. 3, the memory cell array 110 may include a plurality of memory blocks BLK1 to BLKz, Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 4 and 5.

Figure 4:
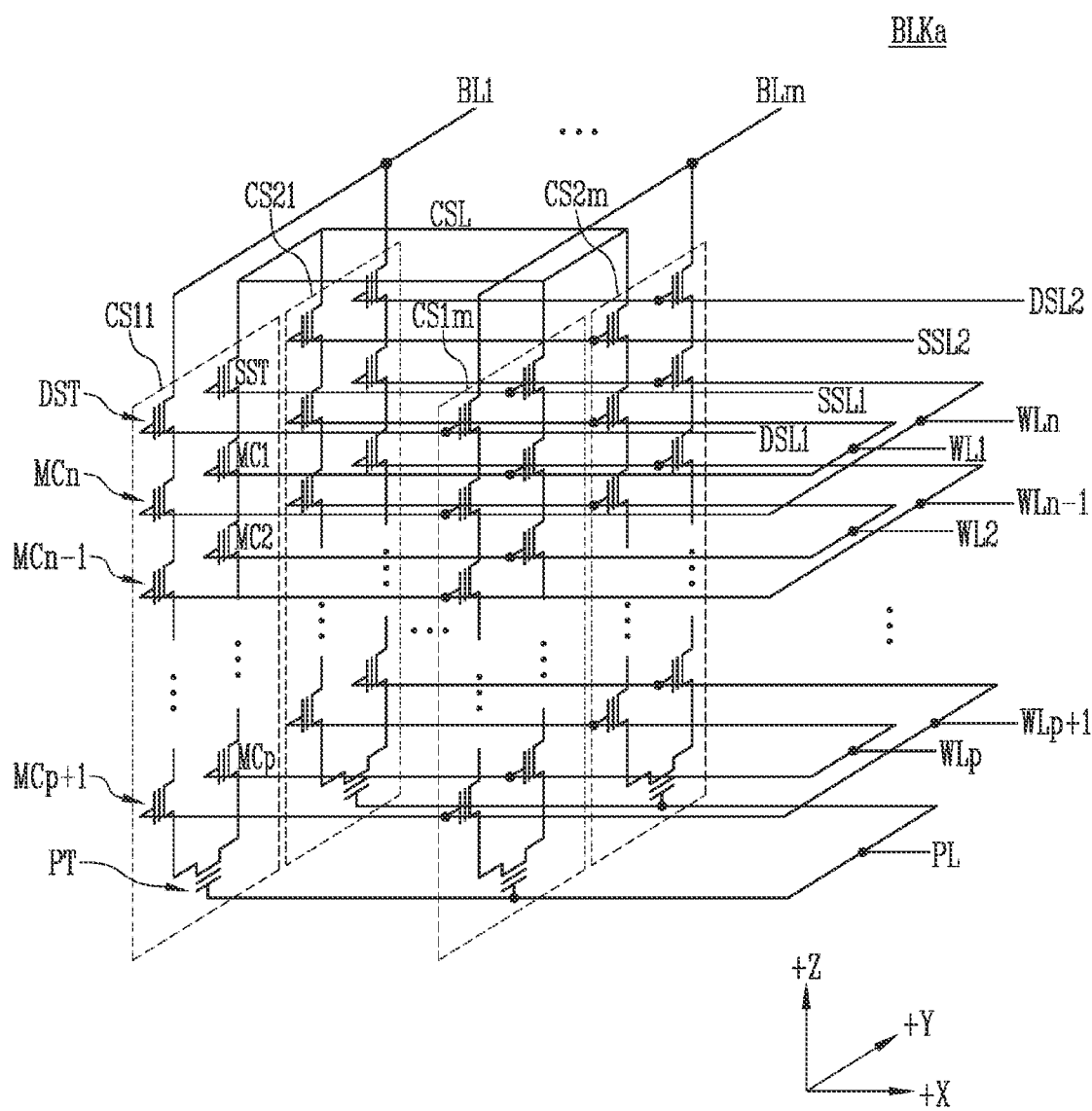
FIG. 4 is a circuit diagram illustrating any one memory block among memory blocks shown in FIG. 3.

FIG. 4 is a circuit diagram illustrating any one memory block BLKa among the memory blocks BLK1 to BLKz shown in FIG. 3.

Referring to FIG. 4, the memory block BLKa may include a plurality of memory cell strings CS11 to CS1m and CS21 to CS2m. In an embodiment, each of the plurality of memory cell strings CS11 to CS1m and CS21 to CS2m may be formed in a 'U' shape. In the memory block BLKa, m memory cell strings may be arranged in a row direction (i.e., a +X direction). FIG. 4 illustrates two memory cell strings that are arranged in a column direction (i.e., a +Y direction). However, this is for convenience of description, and it will be understood that three memory cell strings may be arranged in the column direction.

Each of the plurality of memory cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each memory cell string. In an embodiment, a pillar for providing at least one of the channel layer, the tunneling insulating layer, the charge storage layer, and the blocking insulating layer may be provided in each memory cell string.

The source select transistor SST of each memory cell string may be connected between a common source line CSL and memory cells MC1 to MCp.

In an embodiment, the source select transistors of memory cell strings arranged on the same row may be connected to a source select line extending in the row direction, and the source select transistors of memory cell strings arranged on different rows may be connected to different source select lines. In FIG. 4, the source select transistors of the memory cell strings CS11 to CS1m on a first row may be connected to a first source select line SSL1, The source select transistors of the memory cell strings CS21 to CS2m on a second row may be connected to a second source select line SSL2.

In another embodiment, the source select transistors of the memory cell strings CS11 to CS1m and CS21 to CS2m may be commonly connected to one source select line.

The first to nth memory cells MC1 to MCn of each memory cell string may be connected between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp may be sequentially arranged in the opposite direction of a +Z direction and may be connected in series between the source select transistor SST and the pipe transistor PT. The (p+1)th to nth memory cells MCp+1 to MCn may be sequentially arranged in the +Z direction and may be connected in series between the pipe transistor PT and the drain select transistor DST.

The first to pth memory cells MC1 to MCp and the (p+1)th to nth memory cells MCp+1 to MCn may be connected through the pipe transistor PT, Gate electrodes of the first to nth memory cells MC1 to MCn of each memory cell string may be connected to first to nth word lines WL1 to WLn, respectively.

A gate of the pipe transistor PT of each memory cell string may be connected to a pipe line PL.

The drain select transistor DST of each memory cell string may be connected between a corresponding bit line and the memory cells MCp+1 to MCn, Memory cell strings arranged in the row direction may be connected to a drain select line extending in the row direction. The drain select transistors of the memory cell strings CS11 to CS1m on the first row may be connected to a first drain select line DSL1. The drain select transistors of the memory cell strings CS21 to CS2m on the second row may be connected to a second drain select line DSL2.

Memory cell strings arranged in the column direction may be connected to a bit line extending in the column direction. In FIG. 4, the memory cell strings CS11 and CS21 on a first column may be connected to a first bit line BL1. The memory cell strings CS1m and CS2m on an mth column may be connected to an mth bit line BLm.

Memory cells connected to the same word line in the memory cell strings arranged in the row direction may constitute one page. For example, memory cells connected to the first word line WL1 in the memory cell strings CS11 to CS1m on the first row may constitute one page. Memory cells connected to the first word line WL1 in the memory cell strings CS21 to CS2m on the second row may constitute another page. As any one of the drain select lines DSL1 and DSL2 is selected, memory cell strings arranged in one row direction may be selected. As any one of the word lines WL1 to WLn is selected, one page may be selected in the selected memory cell strings.

In another embodiment, even bit lines and odd bit lines may be provided instead of the first to mth bit lines BL1 to BLm. In addition, even-numbered memory cell strings among the memory cell strings CS11 to CS1m or CS21 to CS2m arranged in the row direction may be connected to the even bit lines, respectively, and odd-numbered memory cell strings among the memory cell strings CS11 to CS1m or CS21 to CS2m arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa may be improved. On the other hand, the size of the memory block BLKa may increase. When the number of dummy memory cells decreases, the size of the memory block BLKa may decrease. On the other hand, the reliability of an operation of the memory block BLKa may decrease.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells may control a voltage applied to the dummy word lines connected to the respective dummy memory cells, so that the dummy memory cells may have the required threshold voltage, FIG. 5 is a circuit diagram illustrating another embodiment BLKb of the one memory block among the memory blocks BLK1 to BLKz shown in FIG. 3.

Figure 5:
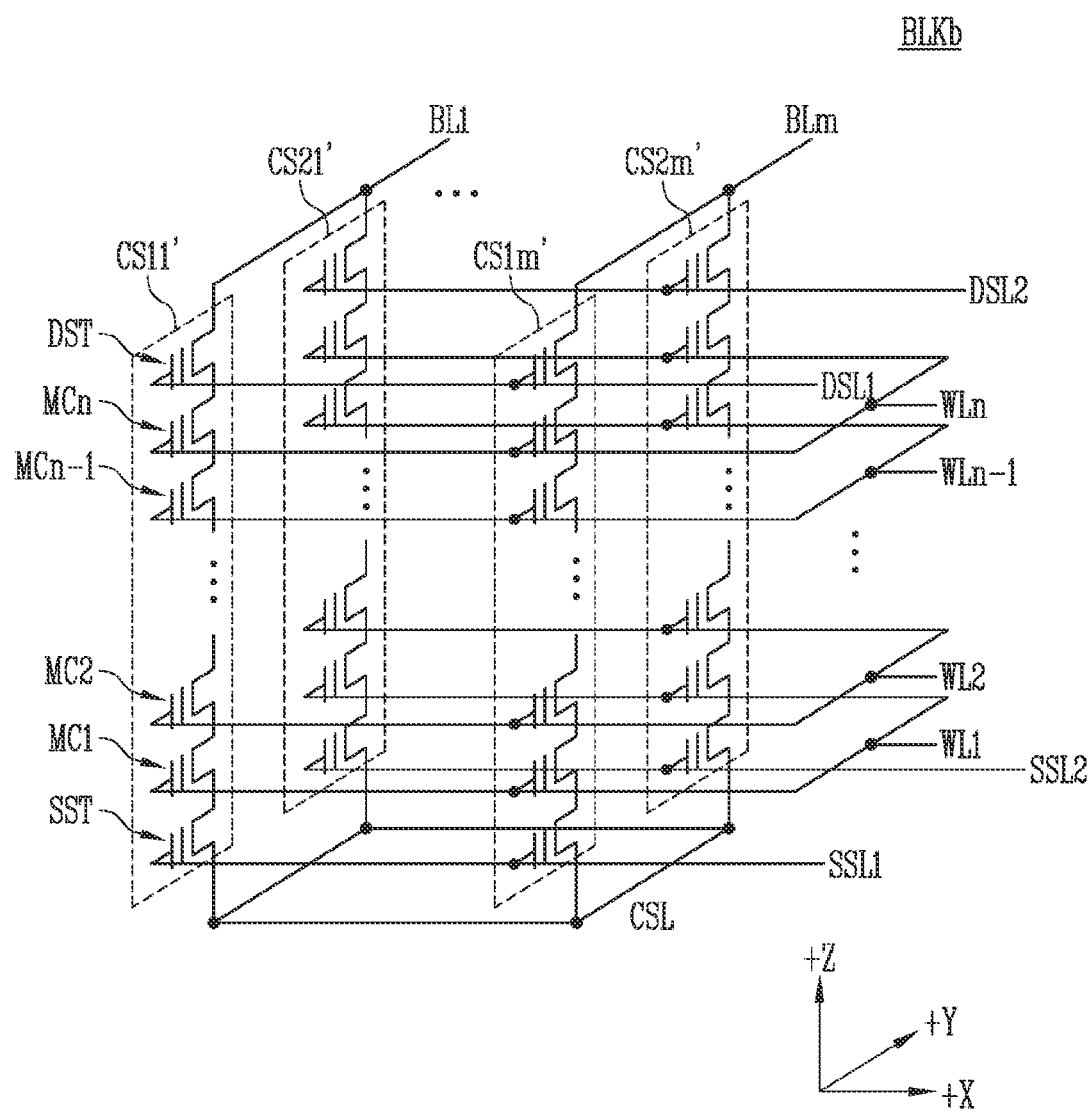
FIG. 5 is a circuit diagram illustrating another embodiment of the one memory block among the memory blocks shown in FIG. 3.

Referring to FIG. 5, the memory block BLKb may include a plurality of memory cell strings CS11' to CS1m' and CS21' to CS2m'. Each of the plurality of memory cell strings CS11' to CS1m' and CS21' to CS2m' may extend along the +Z direction, Each of the plurality of memory cell strings CS11' to CS1m' and CS21' to CS2m' may include at least one source select transistor SST, first to nth memory cells MC1 to MCn, and at least one drain select transistor DST, which may be stacked on a substrate (not shown) under the memory block BLKb.

The source select transistor SST of each memory cell string may be connected between a common source line CSL and the memory cells MC1 to MCn. The source select transistors of memory cell strings arranged on the same row may be connected to the same source select line. The source select transistors of the memory cell strings CS11' to CS1m' arranged on a first row may be connected to a first source select line SSL1. Source select transistors of the memory cell strings CS21' to CS2m' arranged on a second row may be connected to a second source select line SSL2. In another embodiment, the source select transistors of the memory cell strings CS11' to CS1m' and CS21' to CS2m' may be commonly connected to one source select line.

The first to nth memory cells MC1 to MCn of each memory cell string may be connected in series between the source select transistor SST and the drain select transistor DST. Gate electrodes of the first to nth memory cells MC1 to MCn may be connected to first to nth word lines WL1 to WLn, respectively.

The drain select transistor DST of each memory cell string may be connected between a corresponding bit line and the memory cells MC1 to MCn. The drain select transistors of memory cell strings arranged in the row direction may be connected to a drain select line extending in the row direction. The drain select transistors of the memory cell strings CS11' to CS1m' on the first row may be connected to a first drain select line DSL1. The drain select transistors of the memory cell strings CS21' to CS2m' on the second row may be connected to a second drain select line DSL2.

Consequently, the memory block BLKb of FIG. 5 has a circuit similar to that of the memory block BLKa of FIG. 4, except that the pipe transistor PT is excluded from each memory cell string in FIG. 5.

In another embodiment, even bit lines and odd bit lines may be provided instead of the first to mth bit lines BL1 to BLm. In addition, even-numbered memory cell strings among the memory cell strings CS11' to CS1m' or CS21' to CS2m' arranged in the row direction may be connected to the even bit lines, respectively, and odd-numbered memory cell strings among the memory cell strings CS11' to CS1m' or CS21' to CS2m' arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKb may be improved. On the other hand, the size of the memory block BLKb may be increased. When the number of dummy memory cells decreases, the size of the memory block BLKb may decrease. On the other hand, the reliability of an operation of the memory block BLKb may decrease.

In order to efficiently control the at least one dummy memory cell, the dummy memory cells may have a required threshold voltage, Before or after an erase operation of the memory block BLKb, a program operation may be performed on all or some of the dummy memory cells. When an erase operation is performed after the program operation is performed, the threshold voltage of the dummy memory cells may control a voltage applied to the dummy word lines connected to the respective dummy memory cells, so that the dummy memory cells may have the required threshold voltage.

Figure 6:
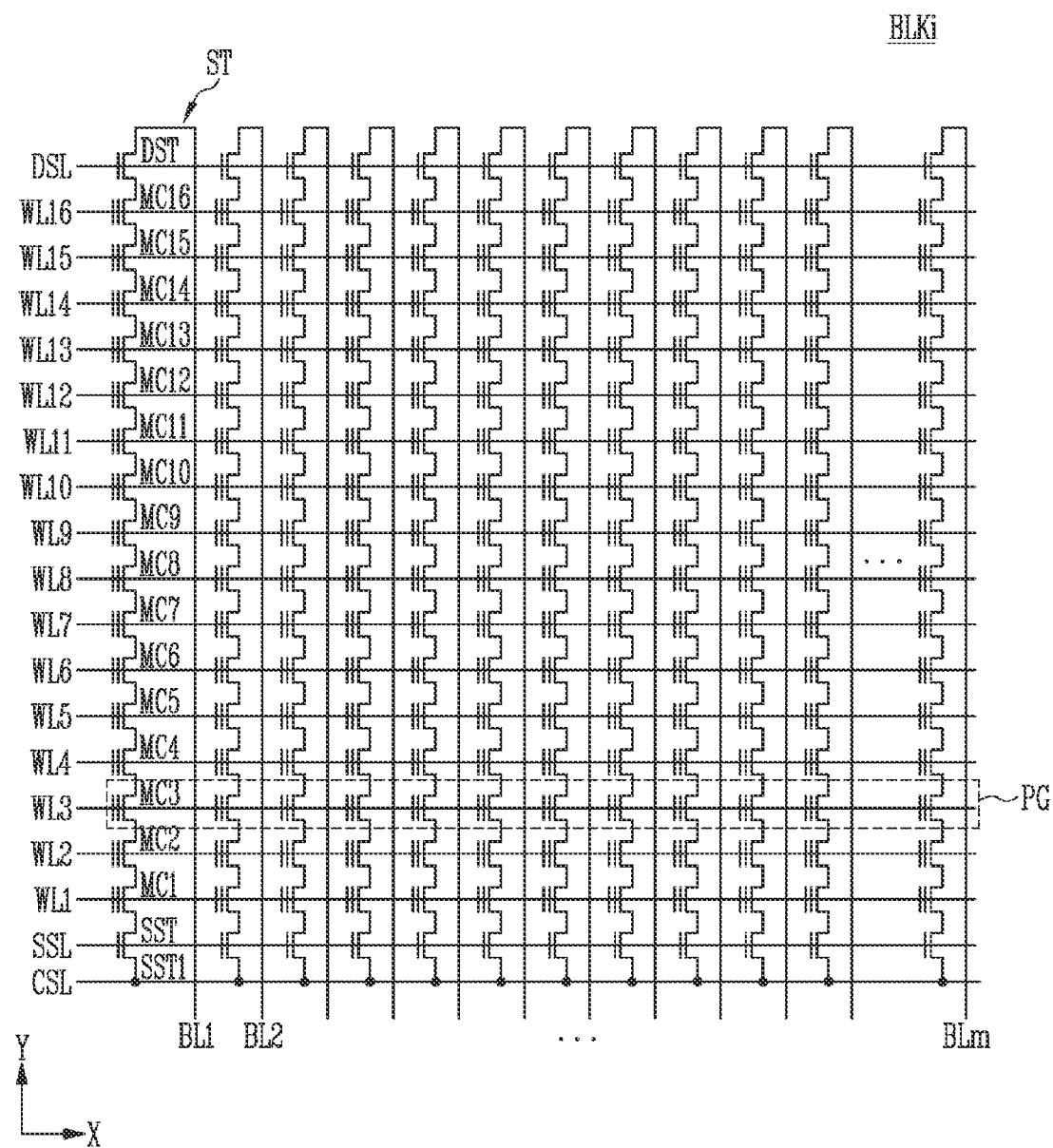
FIG. 6 is a circuit diagram illustrating still another embodiment of the one memory block among the memory blocks shown in FIG. 3.

FIG. 6 is a circuit diagram illustrating still another embodiment BLK1 of the one memory block among the memory blocks BLK1 to BLKz shown in FIG. 3.

Referring to FIG. 6, in the memory block BLKi, a plurality of word lines arranged in parallel to each other may be connected between a first select line and a second select line. The first select line may be a source select line SSL, and the second select line may be a drain select line DSL, More specifically, the memory block BLKi may include a plurality of memory cell strings ST connected between bit lines BL1 to BLm and a common source line CSL. The bit lines BL1 to BLm may be respectively connected to the memory cell strings ST, and the common source line CSL may be commonly connected to the memory cell strings ST, The memory cell strings ST may be configured identically to one another, and therefore, a memory cell string ST connected to a first bit line BL1 will be described in detail as an example.

The memory cell string ST may include a source select transistor SST, a plurality of memory cells MC1 to MC16, and a drain select transistor DST, which nay be connected in series to each other between the common source line CSL and the first bit line BL1. At least one drain select transistor DST may be included in one memory cell string ST, and source select transistors of which a number is greater than that of the source select transistor SST shown in the drawing and memory cells of which a number is greater than that of the memory cells MC1 to MC16 shown in the drawing may be included in the one memory cell string ST.

A source of the source select transistor SST may be connected to the common source line SL, and a drain of the drain select transistor DST may be connected to the first bit line BL1. The memory cells MC1 to MC16 may be connected in series between the source select transistor SST and the drain select transistor DST. Gates of source select transistors SST included in different memory cell strings ST may be connected to the source select line SSL, and gates of drain select transistors DST included in different memory cell strings ST may be connected to the drain select line DSL. Gates of the memory cells MC1 to MC16 may be connected to a plurality of word lines WL1 to WL16. A group of memory cells connected to the same word line among memory cells included in different memory cell strings ST may be referred to as a physical page PG. Therefore, physical pages PG corresponding to the number of the word lines WL1 to WL16 may be included in the memory block BLKi.

One memory cell may store one-bit data. The one memory cell may generally be referred to as a single level cell (SLC). One physical page PG may store one logical page (LPG) data. One LPG data may include data bits corresponding to the number of cells included in the one physical page PG.

One memory cell may store two or more-bit data. One physical page PG may store two or more LPG data.

Figure 7:
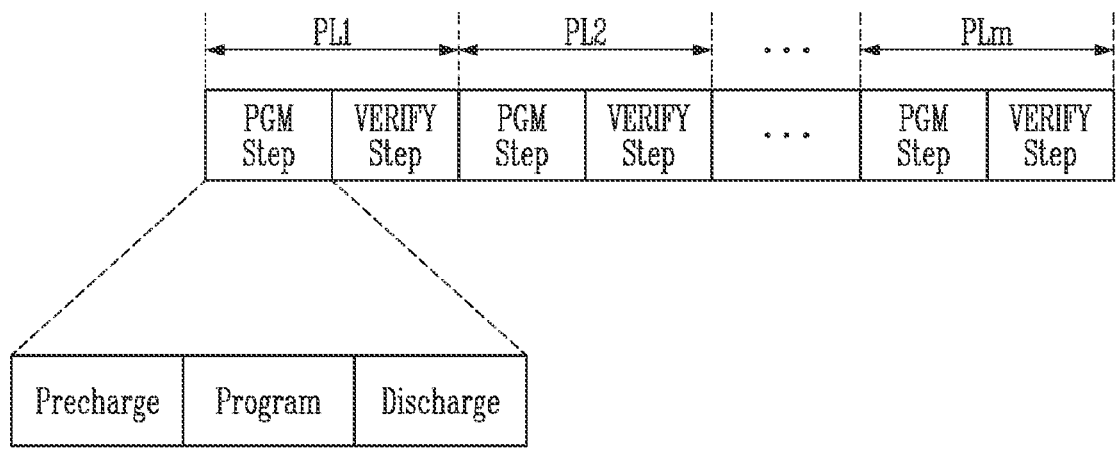
FIG. 7 is a diagram illustrating a program operation of the memory device shown in FIG. 2.

FIG. 7 is a diagram illustrating a program operation of the memory device shown in FIG. 2.

In FIG. 7, for convenience of description, it is assumed that each of a plurality of memory cells may be a Multi-Level Cell (MLC) storing 2-bit data. However, the scope of the present disclosure is not limited thereto, and each of the plurality of memory cells may be a Triple Level Cell (TLC) storing 3-bit data or a Quadruple Level Cell (QLC) storing 4-bit data.

A program operation of the memory device 100 may include a plurality of program loops PL1 to PLm, That is, the memory device 100 may program selected memory cells to have a threshold voltage corresponding to any one state among a plurality of program states by performing the plurality of program loops PL1 to PLm.

Each of the plurality of program loops PL1 to PLm may include a program voltage apply step PGM step of providing a program voltage and a verify step Verify Step of determining whether memory cells have been programmed by applying verify voltages.

The program voltage apply step PGM Step included in each program loop may include a precharge period Precharge, a program period Program, and a discharge period Discharge.

In the precharge period Precharge, an operation of precharging a plurality of memory cell strings may be performed. The operation of precharging the plurality of memory cell strings may be designated as a "string precharge operation."

Also, in the precharge period Precharge, an operation of setting a bit line voltage as a voltage applied to a plurality of bit lines may be performed. The operation of setting the bit line voltage may be referred to as a "bit line setup operation."

The bit line setup operation may include an operation of setting the bit line voltage as a program allow voltage or a program inhibit voltage. When a program pulse is applied to a selected word line in a subsequent program period Program, a memory cell connected to a bit line of which the bit line voltage is set as the program allow voltage may have an increased threshold voltage. Also, in the subsequent program period Program, a threshold voltage of a memory cell connected to a bit line of which the bit line voltage is set as the program inhibit voltage may be maintained.

In an embodiment, the program allow voltage may be a ground voltage. In addition, the program inhibit voltage may be a power voltage. Specifically, the operation of setting the bit line voltage may be performed by increasing page buffer control signals applied to the page buffers from a turn-off voltage to a turn-on voltage.

The string precharge operation may include an operation of transferring a voltage applied from a common source line to unselected memory cell strings. For example, since different memory cell strings are commonly connected to the same word line, memory cells included in an unselected memory cell string may be influenced by a program pulse applied to a word line, in a program operation on a selected memory cell string.

Therefore, a voltage of channel regions of the unselected memory cell strings may be sufficiently increased in advance, so that a threshold voltage of memory cells included in the unselected memory cell strings may be prevented from being unintentionally moved.

In an embodiment, the memory device 100 may simultaneously perform the string precharge operation and the bit line setup operation in the precharge period Precharge.

The program period Program may be a period in which a selected memory cell is programmed to have a threshold voltage corresponding to a program state. For example, the memory device 100 may apply a program voltage to a selected word line and may apply a program pass voltage with a level lower than that of the program voltage to unselected word lines. Also, the memory device 100 may apply a ground voltage corresponding to 0V to a selected bit line and may apply a power voltage to unselected bit lines. Accordingly, the memory device 100 may program the selected memory cell to have the threshold voltage corresponding to the program state.

The discharge period Discharge may be a period in which voltages applied to word lines and select lines are discharged. The memory device 100 may discharge the voltages applied to the word lines and the select lines by applying the ground voltage corresponding to 0V to the word lines and the select lines.

Figure 8:
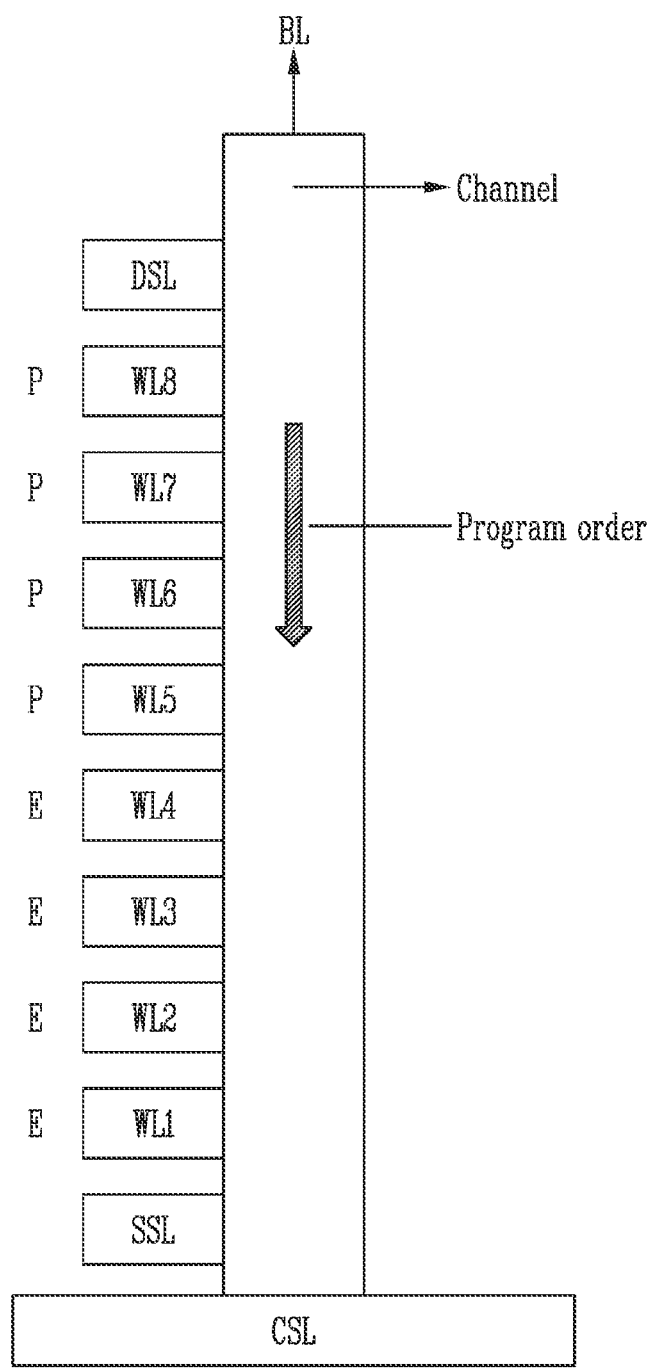
FIG. 8 is a diagram illustrating an order in which memory cells included in the memory device shown in FIG. 2 are programmed.

FIG. 8 is a diagram illustrating an order in which memory cells included in the memory device shown in FIG. 2 may be programmed.

In FIG. 8, a memory cell string is illustrated. The memory cell string may include a plurality of memory cells connected in series between a bit line BL and a common source line CSL. The memory cells may be respectively connected to word lines. A drain select transistor may be connected between the memory cells and the bit line, and a source select transistor may be connected between the memory cells and the common source line. The drain select transistor may be controlled through a drain select line DSL, and the source select transistor may be controlled through a source select line SSL.

For convenience of description, it is assumed that the memory cell string is connected to eight word lines WL1 to WL8. Also, it is assumed that memory cells connected to fifth to eighth word lines WL5 to WL8 are programmed memory cells, and memory cells connected to first to fourth word lines WL1 to WL4 are memory cells before the memory cells are programmed.

In an embodiment, a program operation may be sequentially performed in a direction from the eighth word line WL8 adjacent to the drain select line DSL to the first word line WL1 adjacent to the source select line SSL. This is referred to as a reverse order.

In the precharge period described with reference to FIG. 7, the memory device 100 may precharge a channel Channel of the memory cell string through the common source line CSL. For example, the memory device 100 may precharge the channel Channel through the common source line CSL and the source select line SSL in a state in which the source select transistor is turned on. The drain select transistor may be in a state in which the drain select transistor is turned off. That is, the memory device 100 may precharge an unselected memory cell string before the program voltage is applied so as to reduce disturbance in the program operation. The reduction of the disturbance becomes larger as the level of a voltage precharged in the common source line CSL becomes higher.

Figure 9:
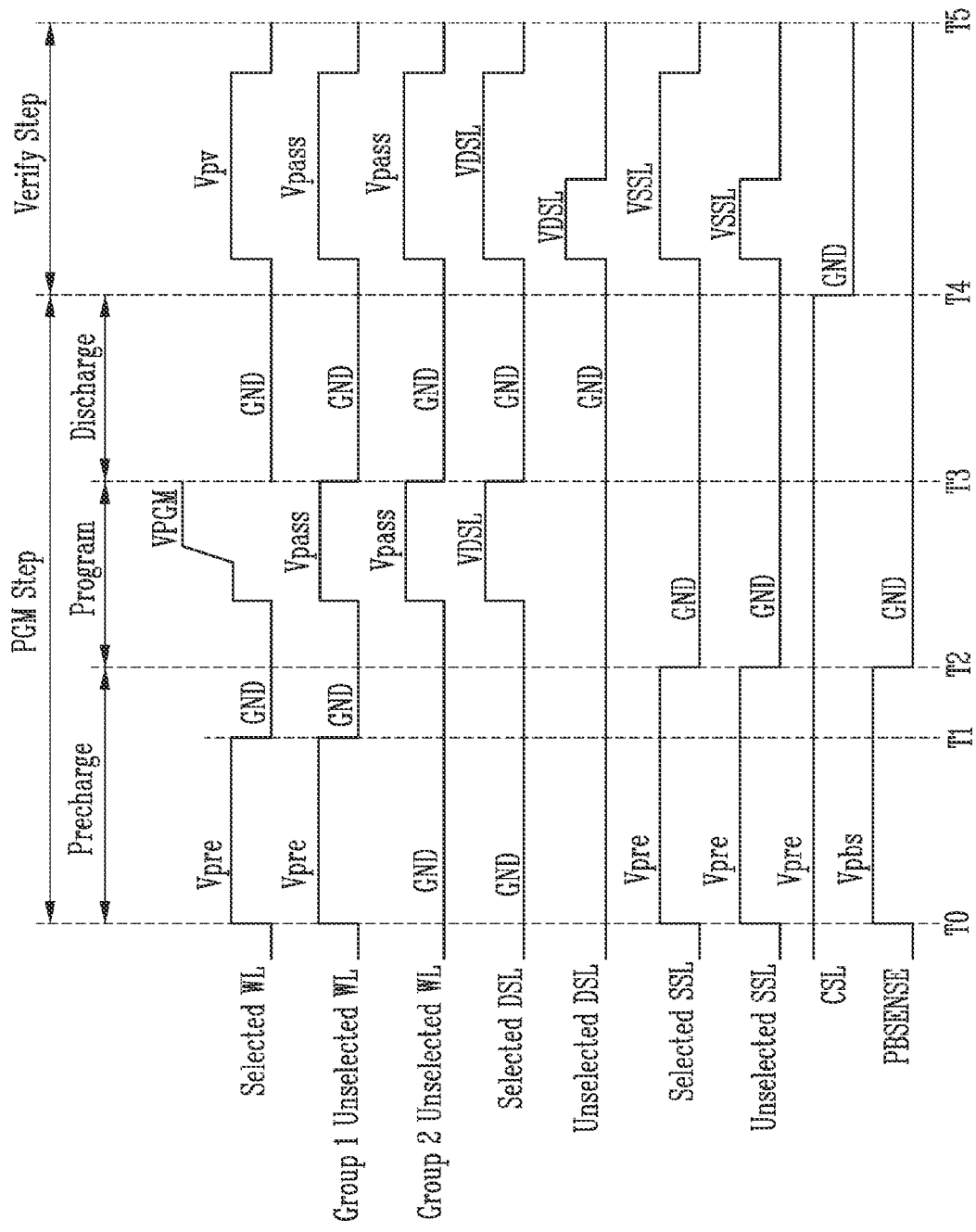
FIG. 9 is a waveform diagram illustrating an operating method of a memory device in accordance with an embodiment of the present disclosure.

FIG. 9 is a waveform diagram illustrating an operating method of a memory device in accordance with an embodiment of the present disclosure.

The operating method shown in FIG. 9 may be performed by, for example, the memory device 100 shown in FIG. 2.

In FIG. 9, T0 to T4 represents a program voltage apply step PGM Step included in a program operation, and T4 to T5 represents a verify step Verify Step. The memory device 100 may perform a verify step Verify Step before T0.

The program voltage apply step PGM Step may include a precharge period Precharge, a program period Program, and a discharge period Discharge.

T0 to T2 may be the precharge period Precharge, T2 to T3 may be the program period Program, and T3 to T4 may be the discharge period Discharge.

Memory cells may be sequentially programmed according to a word line order. Therefore, memory cells connected to word lines programmed earlier than a selected word line Selected WL among unselected word lines Unselected WL may be in a state in which the memory cells are programmed, and memory cells connected to word lines to be programmed later than the selected word line Selected WL may have a threshold voltage corresponding to an erase state.

In FIG. 9, it is assumed that the memory device 100 sequentially may perform a program operation in a direction from a word line WL adjacent to a drain select line DSL to a word line WL adjacent to a source select line SSL. Therefore, memory cells connected to unselected word lines Unselected WL located between the selected word line Selected WL and the source select line SSL may be memory cells on which the program operation is not performed. In addition, memory cells connected to unselected word line Unselected WL located between the selected word line Selected WL and the drain select line DSL may be memory cells on which the program operation has already been performed.

In FIG. 9, a first unselected word line group GROUP 1 Unselected WL may correspond to unselected word lines Unselected WL located between the selected word line Selected WL and the source select line SSL. A second unselected word line group GROUP 2 Unselected WL may correspond to unselected word lines Unselected WL located between the selected word line Selected WL and the drain select line DSL.

Since the first unselected word line group GROUP 1 Unselected WL is to be programmed later than the selected word line Selected WL, memory cells connected to the first unselected word line group GROUP 1 Unselected WL may be memory cells of the erase state, Since the second unselected word line group GROUP 2 Unselected WL is programmed earlier than the selected word line Selected WL, memory cells connected to the second unselected word line group GROUP 2 Unselected WL may be in a state in which the memory cells are programmed to a threshold voltage corresponding to stored data.

At T0, the memory device 100 may precharge the selected word line Selected WL. For example, the memory device 100 may apply a precharge voltage Vpre to the selected word line Selected WL. Accordingly, the voltage of the selected word line Selected WL may be increased. Also, the memory device 100 may apply the precharge voltage Vpre to the first unselected word line group GROUP 1 Unselected WL. Accordingly, the voltage of the first unselected word line group GROUP 1 Unselected WL may be increased. The memory device 100 may apply a ground voltage GND to the second unselected word line group GROUP 2 Unselected WL.

Also, the memory device 100 may precharge a common source line CSL. For example, the memory device 100 may apply the precharge voltage to the common source line CSL. Accordingly, the voltage of the common source line CSL may be increased. The voltage applied to the common source line CSL may be a voltage for precharging unselected memory cell strings.

The memory device 100 may precharge channel regions of a plurality of memory cell strings through the common source line CSL. Specifically, the memory device 100 may perform a string precharge operation.

In an embodiment, the memory device 100 may apply the precharge voltage Vpre applied to the common source line CSL to a source select line of each of the plurality of memory cell strings.

For example, the memory device 100 may apply the precharge voltage Vpre to a selected source selected line Selected SSL as a source select line of a selected memory cell string. Also, the memory device 100 may apply the precharge voltage Vpre to an unselected source select line Unselected SSL as a source select line of an unselected memory cell string. Accordingly, the voltages of the selected source select line Selected SSL and the unselected source select line Unselected SSL may be increased.

Also, the memory device 100 may apply the ground voltage GND at which a drain select transistor is turned off to a selected drain select line Selected DSL as a drain select line of the selected memory cell string. Also, the memory device 100 may apply the ground voltage GND at which the drain select transistor may be turned off to an unselected drain select line Unselected DSL as a drain select line of the unselected memory cell string. Accordingly, the voltages of the selected drain select line Selected DSL and the unselected drain select line Unselected DSL may be decreased.

The memory device 100 may set a bit line voltage applied to a bit line while the channel regions of the plurality of memory cell strings are being precharged. Specifically, the memory device 100 may simultaneously perform the string precharge operation and a bit line setup operation, with precharging of memory cell strings starting before bit line voltage being applied to the bit line.

In an embodiment, the memory device 100 may set the bit line voltage according to data to be stored in memory cells connected to the selected word line Selected WL among word lines connected to a plurality of memory cells.

In an embodiment, the memory device 100 may set the bit line voltage as one of a program allow voltage or a program inhibit voltage.

For example, the memory device 100 may apply the program allow voltage or the program inhibit voltage to bit lines by increasing a page buffer control signal PBSENSE to a turn-on voltage Vpbs.

At T1, the memory device 100 may apply the ground voltage GND to the selected word line Selected WL and the first unselected word line group GROUP 1 Unselected WL. Accordingly, the voltages of the selected word line Selected WL and the first unselected word line group GROUP 1 Unselected WL may be decreased.

At T2, the string precharge operation and the bit line setup operation may be ended.

At T2, the memory device 100 may apply the ground voltage GND to the selected source line Selected SSL and the unselected source select line Unselected SSL. Accordingly, the voltages of the selected source line Selected SSL and the unselected source select line Unselected SSL may be decreased.

Also, the memory device 100 may decrease the page buffer control signal PBSENSE to the ground voltage GND.

At T2, the memory device 100 may provide a program voltage VPGM to the selected word line Selected WL.

For example, the memory device 100 may apply a pass voltage Vpass to the word lines Selected WL, GROUP 1 Unselected WL, and GROUP 2 Unselected WL. Subsequently, the memory device 100 may apply the program voltage VPGM to the selected word line Selected WL. The voltages of the other unselected word lines GROUP 1 Unselected WL and GROUP 2 Unselected WL maintain the pass voltage Vpass.

Also, the memory device 100 may apply a drain select voltage VDSL at which the drain select transistor may be turned on to the selected drain select line Selected DSL.

At T3, the memory device 100 may discharge the selected word line Selected WL.

For example, the memory device 100 may apply the ground voltage GND to the word lines Selected WL, GROUP 1 Unselected WL, and GROUP 2 Unselected WL.

Also, the memory device 100 may apply the ground voltage GND at which the drain select transistor may be turned off to the selected drain select line Selected DSL.

At T4, the memory device may apply a verify voltage Vpv to the selected word line Selected WL, and may apply a pass voltage Vpass to the unselected word lines GROUP 1 Unselected WL and GROUP 2 Unselected WL, The verify voltage Vpv may be a voltage for determining a program state of selected memory cells. The pass voltage Vpass may be a voltage at which memory cells connected to the unselected word lines GROUP 1 Unselected WL and GROUP 2 Unselected WL are turned on to have no influence on the voltage of the bit line.

Also, the memory device 100 may apply the drain select voltage VDSL at which the drain select transistor may be turned on to the selected drain select line Selected DSL. Also, the memory device 100 may apply the drain select voltage VDSL at which the drain select transistor may be turned on to the unselected drain select line Unselected DSL. This is for the purpose of preventing a channel potential of the unselected memory cell string from being excessively increased by the high-potential verify pass voltage Vpass applied to the unselected word lines GROUP 1 Unselected WL and GROUP 2 Unselected WL.

Also, the memory device 100 may apply a source select voltage VSSL at which a source select transistor is turned on to the selected source select line Selected SSL. Also, the memory device 100 may apply the source select voltage VSSL at which the source select transistor is turned on to the unselected source select line Unselected SSL. This is for the purpose of preventing a channel potential of the unselected memory cell string from being excessively increased by the high-potential verify pass voltage Vpass applied to the unselected word lines GROUP 1 Unselected WL and GROUP 2 Unselected WL.

The ground voltage GND may be applied to the common source lire CSL.

Subsequently, at T5, the verify step Verify Step may be ended.

Referring to FIG. 9, the string precharge operation and the bit line setup operation may be simultaneously performed. A current necessary for the string precharge operation and a current necessary for the bit line setup operation may be simultaneously consumed. Accordingly, a current consumed in the memory device 100 may be instantaneously rapidly increased.

In accordance with the embodiment of the present disclosure, the string precharge operation and the bit line setup operation may be simultaneously performed, but may be controlled to start at different times. Accordingly, the current consumed in the memory device 100 may be temporally distributed, so that a peak current generated in the string precharge operation and the bit line setup operation may be reduced. This will be described in detail with reference to FIG. 10.

Figure 10:
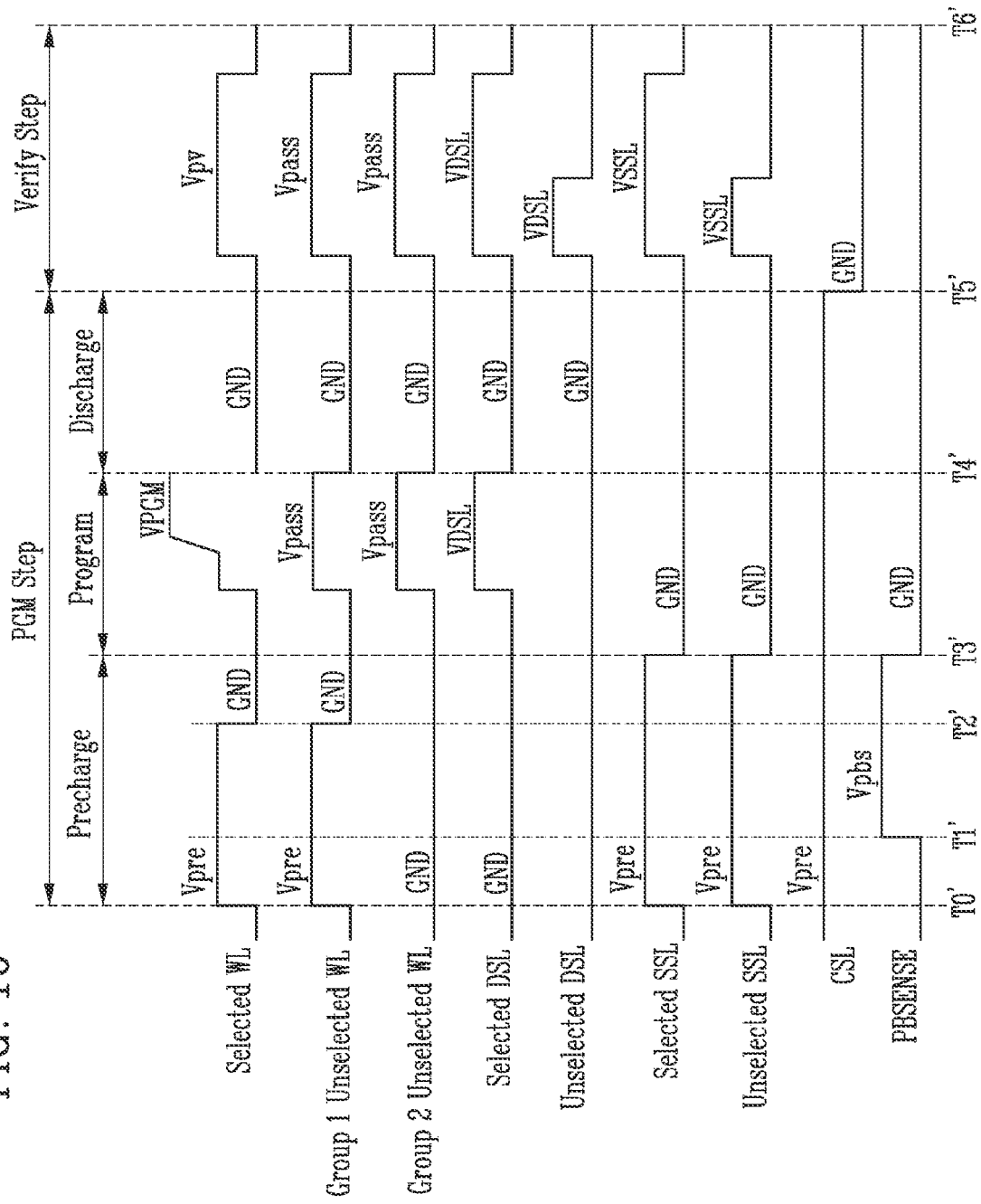
FIG. 10 is a waveform diagram illustrating an operating method of a memory device in accordance with an embodiment of the present disclosure.

FIG. 10 is a waveform diagram illustrating an operating method of a memory device in accordance with an embodiment of the present disclosure.

The operating method shown in FIG. 10 may be performed by, for example, the memory device 100 shown in FIG. 2.

In FIG. 10, T0' to T5' represents a program voltage apply step PGM Step included in a program operation, and T5' to T6' represent a verify step Verify Step. The memory device 100 may perform a verify step Verify Step before T0'.

T0' to T3' may be a precharge period Precharge, T3' to T4' may be a program period Program, and T4' to T5' may be a discharge period Discharge.

An operation in a period T2' to T6' may be identical to that of the memory device in the period T1 to T5, which is described with reference to FIG. 9.

The embodiment shown in FIG. 10 may be different from the embodiment shown in FIG. 9, in that, at T0' to T2', a string precharge operation and a bit line setup operation may be simultaneously performed, but may start at different times.

In an embodiment, while channel regions of the plurality of memory cell strings are being precharged, the memory device 100 may set a bit line voltage applied to a bit line, after starting precharging the channel regions of the plurality of memory cell strings. For example, a voltage may be applied to increase a voltage of a source select line of each of the plurality of memory cell strings and after a predetermined time elapses from a time at which the voltage applied to the source select line of each of the plurality of memory cell strings is increased, the memory device 100 may set the bit line voltage applied to the bit line.

Specifically, at T0', the memory device 100 may start a string precharge operation.

For example, the memory device 100 may apply the precharge voltage Vpre to the common source line CSL. Also, the memory device 100 may apply the precharge voltage Vpre to the selected source select line Selected SSL and the unselected source select line Unselected SSL. Also, the memory device 100 may apply the ground voltage GND to the selected drain select line DSL and the unselected drain select line Unselected DSL. Also, the memory device 100 may apply the precharge voltage Vpre to the selected word line Selected WL and the first unselected word line group GROUP 1 Unselected WL. Also, the memory device 100 may apply the ground voltage GND to the second unselected word line group GROUP 2 Unselected WL.

Subsequently, at T1', the memory device 100 may start a bit line setup operation while performing the string precharge operation. For example, when a predetermined period of time elapses after applying the precharge voltage Vpre to the selected source select line Selected SSL and the unselected source select line Unselected SSL, the memory device 100 may increase the level of the page buffer control signal PBSENSE to the turn-on voltage Vpbs. The memory device 100 may apply the program allow voltage or the program inhibit voltage to the bit lines based on the page buffer control signal PBSENSE. That is, when a predetermined period of time elapses after applying the precharge voltage to the source select line of each of the plurality of memory cell strings, the memory device 100 may set the bit line voltage.

Accordingly, a current consumed in the memory device 100 may be temporally distributed, so that a peak current generated in the string precharge operation and the bit line setup operation may be reduced.

Figure 11:
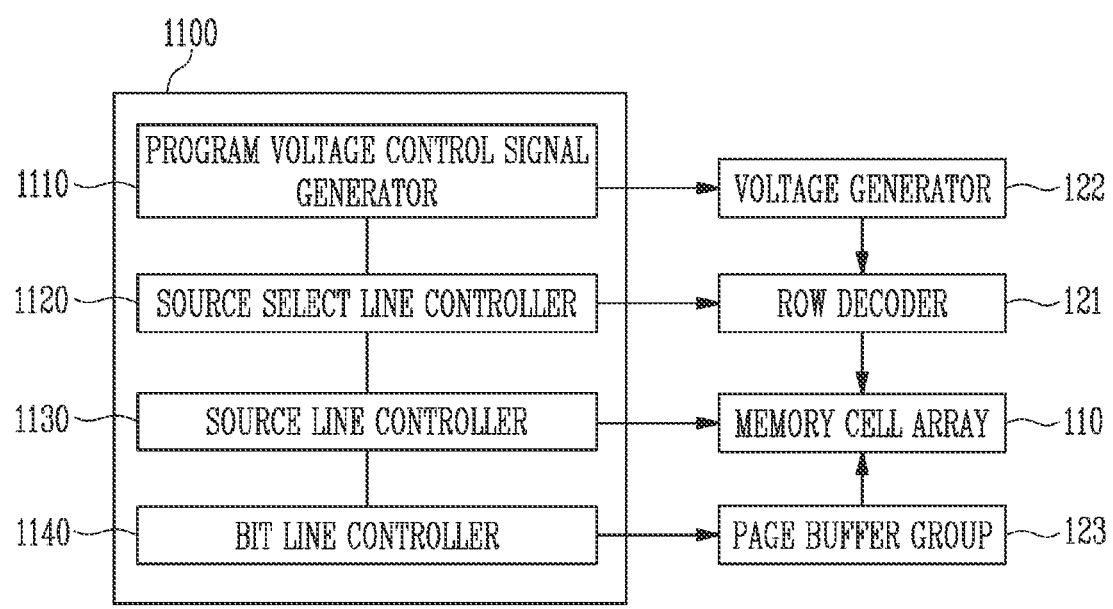
FIG. 11 is a configuration diagram of a program operation controller included in a control logic shown in FIG. 2.

FIG. 11 is a configuration diagram of a program operation controller included in the control logic shown in FIG. 2.

In FIG. 11, a memory cell array 110, a row decoder 121, a voltage generator 122, and a page buffer group 123 may be respectively configured and operated identically to the memory cell array 110, the row decoder 121, the voltage generator 122, and the page buffer group 123, which are described with reference to FIG. 2. A program operation controller 1100 may represent the program operation controller 131 shown in FIG. 2.

Referring to FIG. 11, the program operation controller 1100 may include a program voltage control signal generator 1110, a source select line controller 1120, a source line controller 1130, and a bit line controller 1140.

The program voltage control signal generator 1110 may generate a program voltage control signal instructing that a plurality of voltage used in a program voltage apply step are to be generated.

In an embodiment, the program voltage control signal generator 1110 may generate a precharge voltage control signal instructing that precharge associated voltages as voltages with various levels, which are used in a precharge period, are to be generated. Also, the program voltage control signal generator 1110 may provide the precharge voltage control signal to the voltage generator 122, The voltage generator 122 may generate various precharge associated voltages used in the precharge period according to the precharge voltage control signal Subsequently, the voltage generator 122 may provide the precharge associated voltages to the row decoder 121.

The source select line controller 1120 may control a voltage applied to a source select line. For example, the source select line controller 1120 may provide the row decoder 121 with a source select line control signal for allowing a precharge voltage to be applied to the source select line. The row decoder 121 may provide the precharge voltage to the memory cell array 110 according to the source select line control signal.

The source line controller 1130 may control the precharge voltage applied to a common source line. For example, the source line controller 1130 may apply the precharge voltage to the common source line of the memory cell array 110.

The bit line controller 1140 may control a bit line voltage applied to a bit line. For example, the bit line controller 1140 may generate page buffer control signals for controlling the bit line voltage. Subsequently, the bit line controller 1140 may transfer the page buffer control signals to the page buffer group 123. The page buffer group 123 may set the bit line voltage as a program allow voltage or a program inhibit voltage according to the page buffer control signals.

Figure 12:
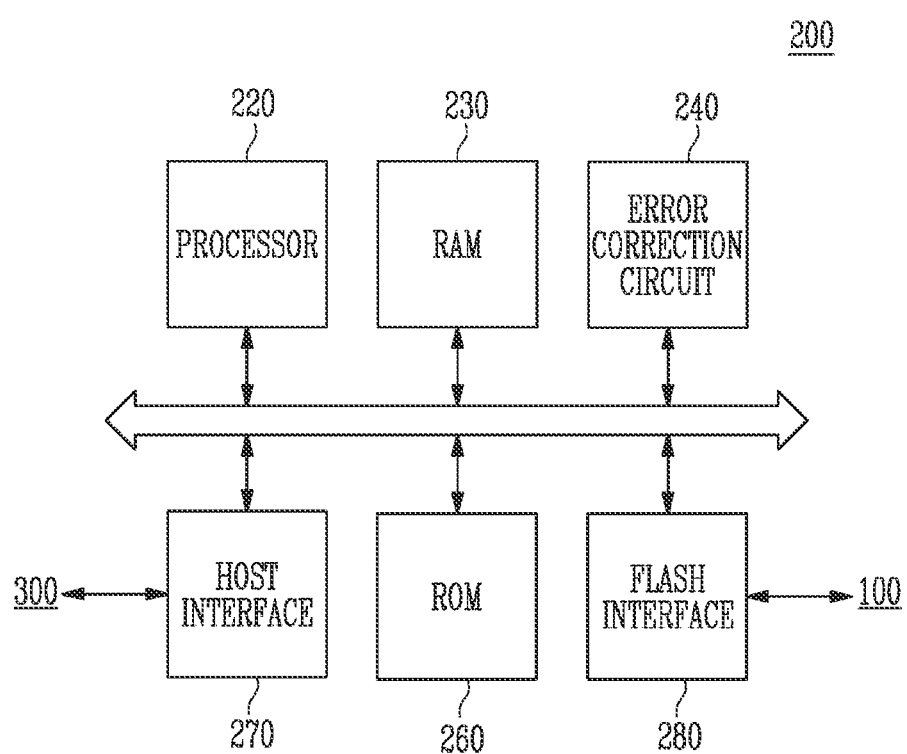
FIG. 12 is a diagram illustrating a memory controller shown in FIG. 1.

FIG. 12 is a diagram illustrating the memory controller shown in FIG. 1.

Referring to FIGS. 1 and 12, the memory controller 200 may include a processor 220, a RAM 230, an error correction circuit 240, ROM 250, a host interface 270, and a flash interface 280.

The processor 220 may control overall operations of the memory controller 200. The RAM 230 may be used as a buffer memory, a cache memory, a working memory, etc. of the memory controller 200.

The error correction circuit 240 may perform error correction. The error correction circuit 240 may perform error correction code (ECC) encoding on data to be written to the memory device through the flash interface 280. The ECC-decoded data may be transferred to the memory device through the flash interface 280. The error correction circuit 240 may perform ECC decoding on data received from the memory device through the flash interface 280. Exemplarily, the error correction circuit 240 may be included as a component of the flash interface 280 in the flash interface 280.

The ROM 260 may store, in the form of firmware, various information required in an operation of the memory controller 200.

The memory controller 200 may communicate with an external device (e.g., the host 300, an application processor, or the like) through the host interface 270.

The memory controller 200 may communicate with the memory device 100 through the flash interface 280, The memory controller 200 may transmit a command CMD, an address ADDR, a control signal CTRL, and the like to the memory device 100 through the flash interface 280, and receive data DATA. Exemplarily, the flash interface 280 may include a NAND interface.

Figure 13:
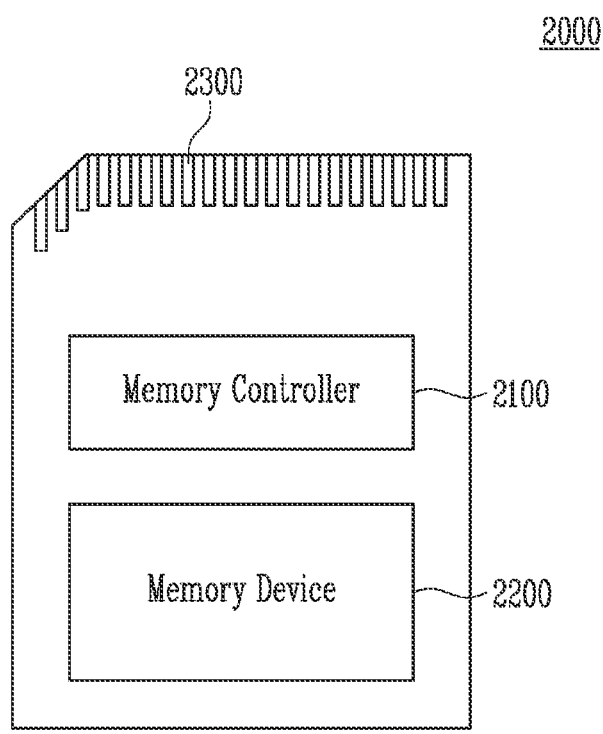
FIG. 13 is a block diagram illustrating a memory card system to which the storage device is applied in accordance with an embodiment of the present disclosure.

FIG. 13 is a block diagram illustrating a memory card system to which the storage device may be applied in accordance with an embodiment of the present disclosure.

Referring to FIG. 13, the memory card system 2000 may include a memory controller 2100, a memory device 2200, and a connector 2300.

The memory controller 2100 may be connected to the memory device 2200, The memory controller 2100 may access the memory device 2200. For example, the memory controller 2100 may control read, write, erase, and background operations of the memory device 2200. The memory controller 2100 may provide an interface between the memory device 2200 and a host Host. The memory controller 2100 may drive firmware for controlling the memory device 2200. The memory controller 2100 may be implemented identically to the memory controller 200 described with reference to FIG. 1. The memory device 2200 may be implemented identically to the memory device 100 described with reference to FIG. 2.

Exemplarily, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol, Exemplarily, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (DATA), a Small Computer System Interface (SCSI), an Enhanced Small Disk Interface (ESDI), an Integrated Drive Electronics (IDE), firewire, a Universal Flash Storage (UFS), Wi-H, Bluetooth, and NVMe. Exemplarily, the connector 2300 may be defined by at least one of the above-described various communication protocols.

Exemplarily, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Transfer Torque magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 14:
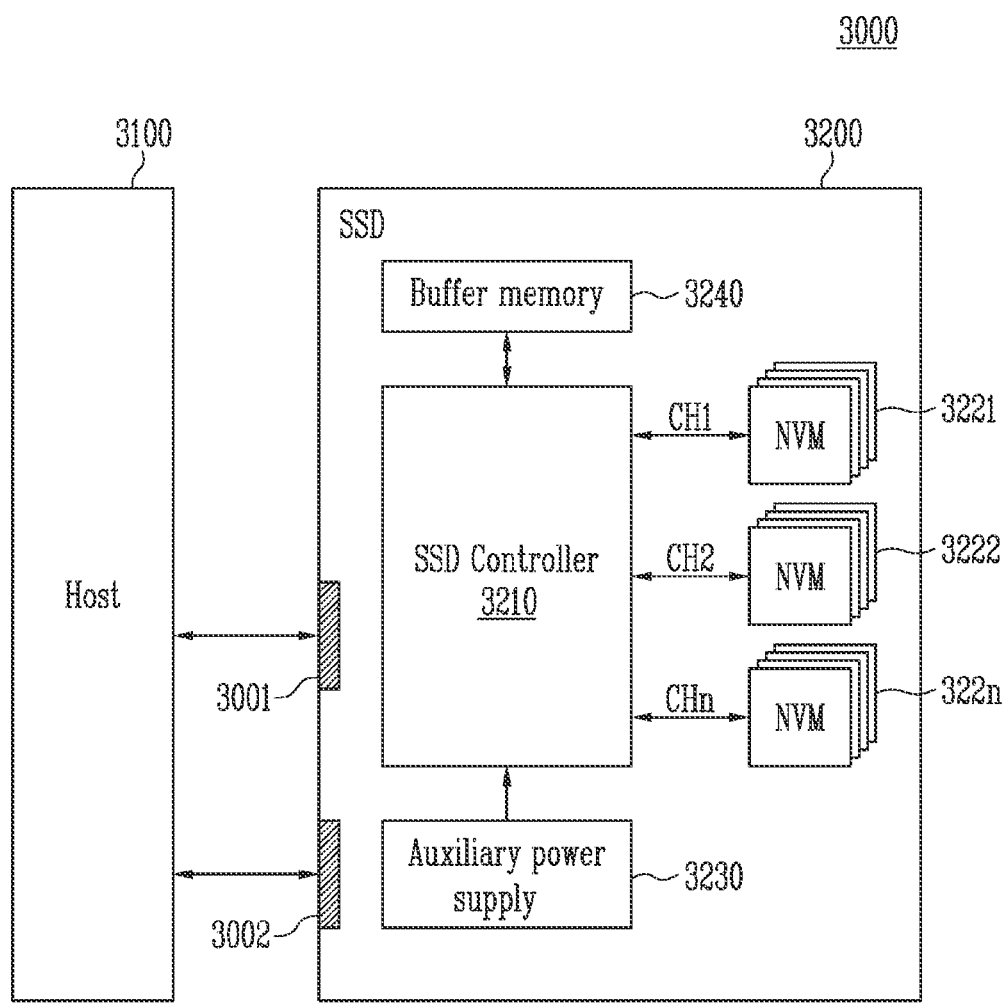
FIG. 14 is a block diagram exemplarily illustrating a Solid State Drive (SSD) system to which the storage device is applied in accordance with an embodiment of the present disclosure.

FIG. 14 is a block diagram exemplarily illustrating a Solid State Drive (SSD) system to which the storage device may be applied in accordance with an embodiment of the present disclosure.

Referring to FIG. 14, the SSD system 3000 may include a host 3100 and an SSD 3200. The SSD 3200 may exchange a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. Exemplarily, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (DATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 may be connected to the host 3100 through the power connector 3002. When the supply of power from the host 3100 is not smooth, the auxiliary power supply 3230 may provide power of the SSD 3200. Exemplarily, the auxiliary power supply 3230 may be located in the SSD 3200, or be located at the outside of the SSD 3200. For example, the auxiliary power supply 3230 may be located on a main board and may provide auxiliary power to the SSD 3200.

The buffer memory 3240 may operate as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM, FIG. 15 is a block diagram illustrating a user system to which the storage device may be applied in accordance with an embodiment of the present disclosure.

Figure 15:
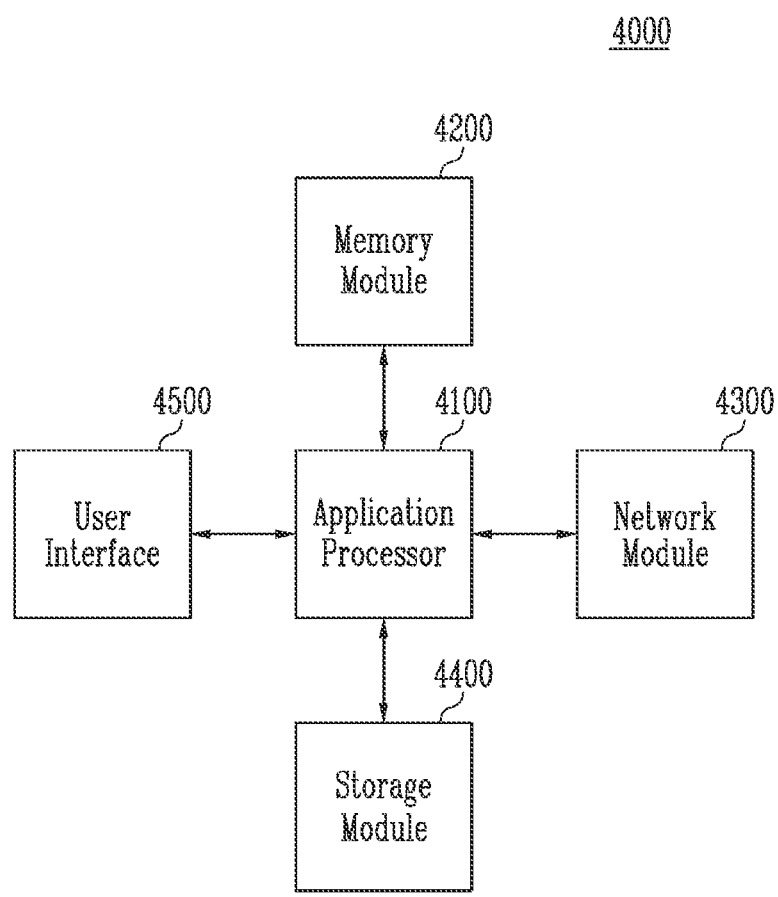
FIG. 15 is a block diagram illustrating a user system to which the storage device is applied in accordance with an embodiment of the present disclosure.

Referring to FIG. 15, the user system 4000 may include an application processor 4100, a memory module 4200, a network module 4300, a storage module 4400, and a user interface 4500.

The application processor 4100 may drive components included in the user system 4000, an operating system (OS), a user program, or the like. Exemplarily, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. Exemplarily, the application processor 4100 and the memory module 4200 may be provided as one semiconductor package by being packaged based on a Package on Package (PoP).

The network module 4300 may communicate with external devices. Exemplarily, the network module 4300 may support wireless communications such as Code Division Multiple Access (CDMA), Global System for Mobile communication (GSM), Wideband CDMA ('CDMA), CDMA-2000, Time Division Multiple Access (TDMA), Long Term Evolution (LTE), Wimax, WLAN, UWB, Bluetooth, and Wi-Fi. Exemplarily, the network module 4300 may be included in the application processor 4100.

The storage module 4400 may store data. For example, the storage module 4400 may store data received from the application processor 4100. Alternatively, the storage module 4400 may transmit data stored therein to the application processor 4100. Exemplarily, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash with a three-dimensional structure, Exemplarily, the storage module 4400 may be provided as a removable drive such as a memory card of the user system 4000 or an external drive.

Exemplarily, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. Exemplarily, the user interface 4500 may include user input interfaces such as a keyboard, a keypad, a button, a touch panel, a touch screen, a touch pad, a touch baa, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, a memory device and an operating method of the memory device may be capable of reducing a peak current.

What is claimed is:

1. A method for operating a memory device including a plurality of memory cell strings each including a plurality of memory cells connected between a common source line and a bit line, a source select line connected between the common source line and the plurality of memory cells, and a drain select line connected between the bit line and the plurality of memory cells, the method comprising:
   precharging channel regions of the plurality of memory cell strings through the common source line; and
   setting a bit line voltage applied to the bit line, after starting precharging the channel regions of the plurality of memory cell strings, while the channel regions of the plurality of memory cell strings are being precharged.

2. The method of claim 1, further comprising applying a precharge voltage to the common source line.

3. The method of claim 2, wherein the precharging of the channel regions includes applying the precharge voltage applied to the common source line to the source select line of each of the plurality of memory cell strings.

4. The method of claim 3, wherein the setting of the bit line voltage includes setting the bit line voltage, after a predetermined period elapses from a time at which the precharge voltage is applied to the source select line of each of the plurality of memory cell strings.

5. The method of claim 1, wherein, in the setting of the bit line voltage, the bit line voltage is set according to data to be stored in memory cells connected to a selected word line among word lines connected to the plurality of memory cells.

6. The method of claim 5, wherein, in the setting of the bit line voltage, the bit line voltage is set as one of a program allow voltage or a program inhibit voltage.

7. The method of claim 1, further comprising turning off a drain select transistor connected to the drain select line, while the channel regions of the plurality of memory cell strings are precharged.

8. The method of claim 1, further comprising applying a precharge voltage to a selected word line among word lines connected to the plurality of memory cells.

9. The method of claim 1, further comprising providing a program voltage to a selected word line among word lines connected to the plurality of memory cells, after the channel regions of the plurality of memory cell strings are precharged.

10. The method of claim 9, further comprising discharging the selected word line, after the program voltage is provided to the selected word line.

11. A memory device comprising:
a plurality of memory blocks each including a plurality of memory cell strings each including a plurality of memory cells connected in series between a common source line and a bit line, a plurality of source select lines connected in series between the common source line and the plurality of memory cells, and a plurality of drain select lines connected in series between the bit line and the plurality of memory cells;
a peripheral circuit configured to perform a plurality of program loops each including a program voltage apply step of providing a program voltage to a selected memory block among the plurality of memory blocks and a verify step of verifying a program state of the selected memory block; and
a program operation controller configured to control the peripheral circuit to precharge channel regions of the plurality of memory cell strings through the common source line and to set a bit line voltage applied to the bit line, at a predetermined time with respect to starting precharging the channel regions of the plurality of memory cell strings, in the program voltage apply step.

12. The memory device of claim 11, wherein the program operation controller includes a program voltage control signal generator configured to generate a program voltage control signal instructing that a plurality of voltages used in the program voltage apply step are to be generated.

13. The memory device of claim 12, wherein the program operation controller further includes a source line controller configured to control a voltage applied to the common source line.

14. The memory device of claim 13, wherein the program operation controller further includes a source select line controller configured to control a voltage applied to the plurality of source select lines.

15. The memory device of claim 14, wherein the program operation controller further includes a bit line controller configured to control the bit line voltage.

16. A method for operating a memory device including a plurality of memory cell strings each including a plurality of memory cells connected between a common source line and a bit line, a source select line connected between the common source line and the plurality of memory cells, and a drain select line connected between the bit line and the plurality of memory cells, the method comprising:
increasing a voltage of the common source line;
increasing a voltage applied to the source select line of each of the plurality of memory cell strings through the common source line; and
setting, after a predetermined elapsed time, a bit line voltage applied to the bit line, after the voltage applied to the source select line of each of the plurality of memory cell strings is increased, while the voltage applied to the source select line of each of the plurality of memory cell strings is increased.

17. The method of claim 16, wherein, in the setting of the bit line voltage, the bit line voltage is set according to data to be stored in memory cells connected to a selected word line among word lines connected to the plurality of memory cells.

18. The method of claim 17, wherein, in the setting of the bit line voltage, the bit line voltage is set as one of a program allow voltage or a program inhibit voltage.

19. The method of claim 16, further comprising turning off a drain select transistor connected to the drain select line, while the voltage applied to the source select line of each of the plurality of memory cell strings is increased.

20. The method of claim 16, further comprising increasing a voltage of a selected word line among word lines connected to the plurality of memory cells.

* * * * *